United States Patent [19]
Sourgen

[11] Patent Number: 5,258,947
[45] Date of Patent: Nov. 2, 1993

[54] MOS FUSE WITH PROGRAMMABLE TUNNEL OXIDE BREAKDOWN

[75] Inventor: Laurent Sourgen, Aix en Provence, France

[73] Assignee: SGS-Thomson Microelectronics, S.A., Gentilly, France

[21] Appl. No.: 623,510

[22] Filed: Dec. 7, 1990

[30] Foreign Application Priority Data

Dec. 7, 1989 [FR] France ............... 89 16196

[51] Int. Cl.$^5$ .................. G11C 17/00; G11C 7/00
[52] U.S. Cl. ................... 365/96; 365/182; 365/218; 365/225.7
[58] Field of Search ........... 365/182, 225.7, 96, 365/218; 307/263, 268; 357/51

[56] References Cited

U.S. PATENT DOCUMENTS

| | | | |
|---|---|---|---|
| 3,576,549 | 4/1971 | Hess | 365/104 |
| 3,668,655 | 6/1972 | Allen | 365/96 |
| 4,507,757 | 3/1985 | McElroy | 365/96 |
| 4,903,111 | 2/1990 | Takemae et al. | 365/96 X |
| 4,932,053 | 6/1990 | Fruhauf et al. | 380/4 |
| 4,935,645 | 6/1990 | Lee | 365/225.7 X |

FOREIGN PATENT DOCUMENTS

| | | | |
|---|---|---|---|
| 2527805 | 12/1983 | France . | |
| 8903081 | 4/1989 | PCT Int'l Appl. . | |
| 2220811 | 1/1990 | United Kingdom | 365/218 |

OTHER PUBLICATIONS

Kendall W. Pope, "No Waiting—EEPROM at Work", 1983, Computer Design, pp. 191-196, vol. 22, No. 7.

*Primary Examiner*—Eugene R. LaRoche
*Assistant Examiner*—Son Dinh

[57] ABSTRACT

A MOS fuse with programmable tunnel oxide breakdown is made up of a tunnel oxide EEPROM cell, which can be programmed/erased by a programming/erasure voltage having a slow-rising edge, while the tunnel oxide can be subjected to breakdown, when desired, by switching over to a programming/erasure voltage having a steep edge. Such fuse can be used in all MOS integrated circuits and particularly in memory card type applications.

27 Claims, 2 Drawing Sheets

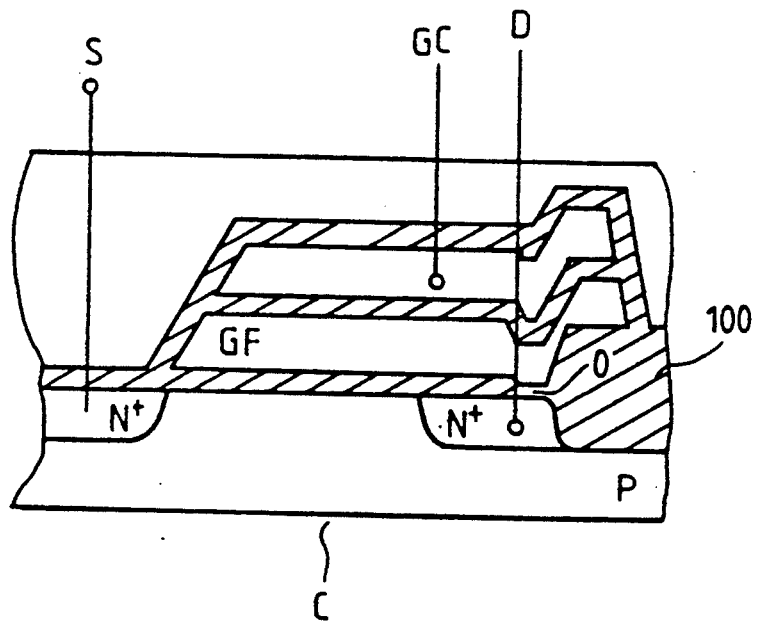
FIG_1
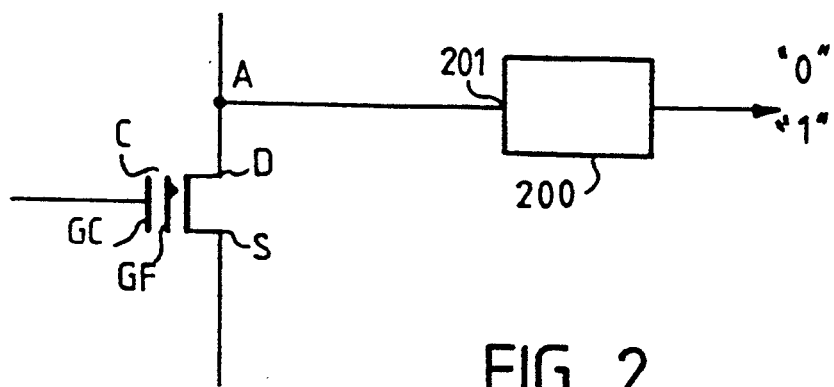
FIG_2

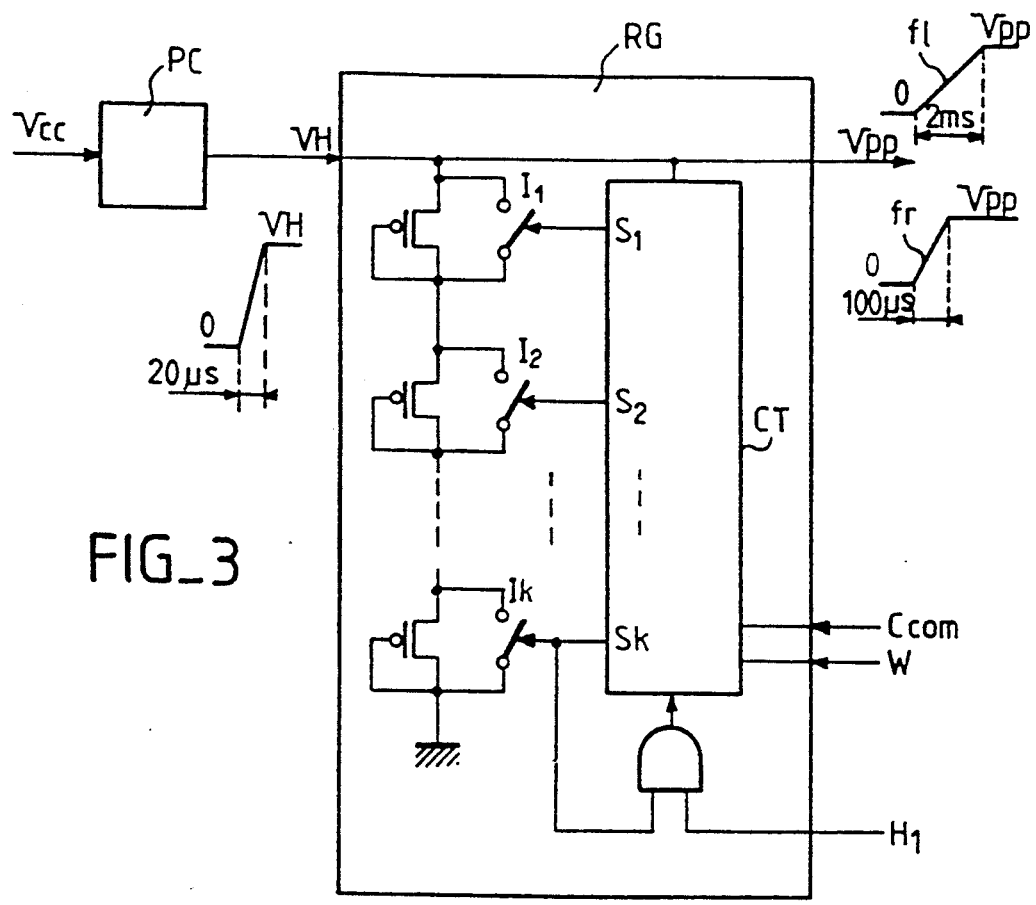
FIG_3
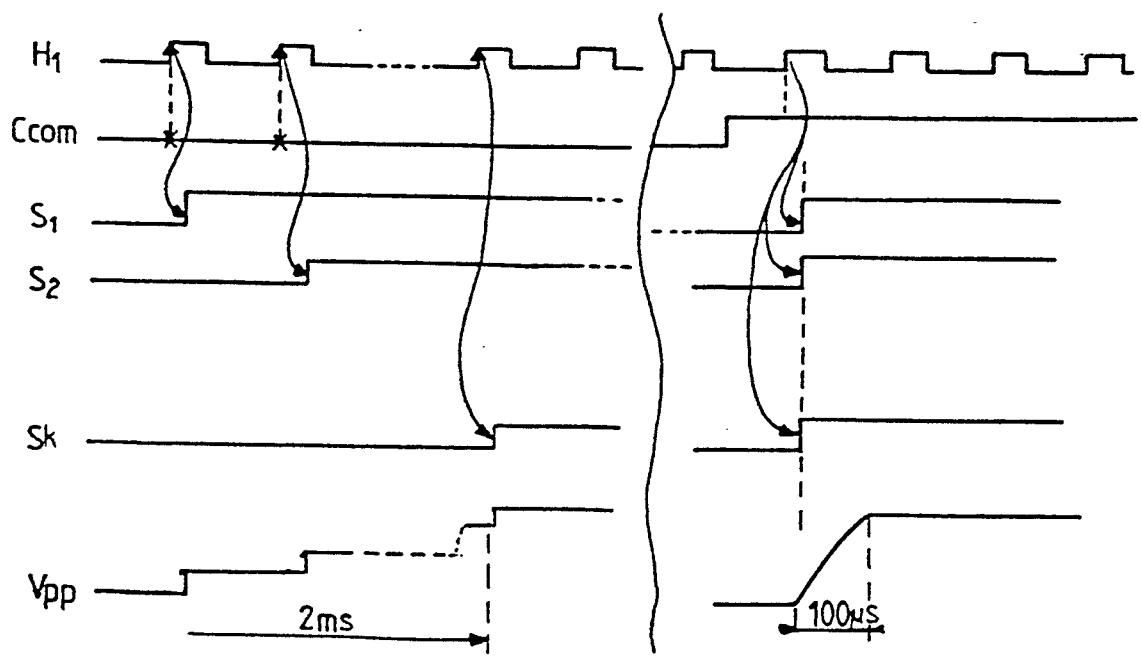
FIG_4-a  FIG_4-b

MOS FUSE WITH PROGRAMMABLE TUNNEL OXIDE BREAKDOWN

BACKGROUND OF THE INVENTION

1. Field of the Invention

The invention is directed to the fuses used in integrated circuits made by MOS technology.

2. Description of the Prior Art

Fuses are used in such circuits to configure them, namely to define, at a given moment, their functions, their resources and their modes or paths of access to these sources. For example, in memory cards, fuses such as these enable an initial EPROM or EEPROM memory plane to be partitioned into zones that are accessible in reading/writing mode and others that are accessible in reading mode only.

Several successive configurations are sometimes necessary. Each of these corresponds to a particular level of use, this use being more restricted and more specialized at each new configuration. For example, it is possible to define three levels or modes of use for a chip card or memory card. Since the first mode is the one obtained after the manufacture of the card, which is called the factory mode, it is the most open and least specialized one. It is characterized by few restrictions or prohibitions with respect to access path. The chip cards may be used for a variety of applications such as telephone, banking and other applications. Hence a first configuration is made to give the card a particular feature: for example the card in factory mode is configured for a banking application. It may then be supplied to a bank. This is an intermediate mode. The access functions and modes have been restricted, i.e. configured to correspond to the formalities proper to a bank card as laid down in a set of specifications of the bank. The bank may then program its own secret information such as an identification number, account number, permitted operations etc. in a given zone. It should then bar any subsequent reprogramming of this zone. It therefore carries out a second configuration, which takes the card in intermediate mode into a final, user mode. It can then forward the card to a user.

This non-exhaustive example of use, however, testifies not only to the usefulness of the fuses in enabling configuration but also to the reliability and security that should be given to these fuses to ensure that the configurations (successive otherwise) of an integrated circuit are irreversible: a set of functions cannot be modified in any way. Indeed, to give only one example, it should not be possible for the user to modify the secret information.

There are different known fuses which can be used in integrated circuits. These fuses are made, for example, in the form of a very thin layer of polycrystalline silicon and are supplied with current, for example by a transistor. When a current flows for a certain time, a local heating occurs because of the very thin section of the fuse. This heating is enough to volatilize the metal: the fuse fuses or breaks down. In fact, it sometimes happens that the fuse does not break down. In practice, a fuse such as this is not reliable.

Besides, it is necessary to note the very widespread use of EPROMs and, above all, EEPROMs in chip cards. The need to keep a record of certain pieces of information and of operations in a chip card which is sometimes under voltage (in the reader) and sometimes off voltage, has ruled out the use of RAMs which are volatile and ROMs which are non-volatile but programmable by mask, during manufacture.

The fact that a permanent record has to be kept, not of all the operations but of only some of them such as the balance of the account for an banking application, only between one use and another of the chip card, has given a certain advantage to the EEPROM, which is electrically erasable in the reader. The fact that an EPROM cannot be erased on the site of the reader leads to the consumption of all the programmable memory. This makes it necessary to change the card when this memory has been entirely programmed. Now, while the notion of a disposable card is still in vogue, the notion of a card rechargeable on site is preferred to it, especially for simple economic reasons. An advantage of a fuse according to the invention is that it forms part of an EEPROM memory plane such as this.

SUMMARY OF THE INVENTION

In the invention, a fuse is made by using the known properties of the EEPROM cells. According to the invention the fuses that have not undergone breakdown are similar to a memory cell: they form part of the memory plane. They are not different additional resources, and their mode of access is that of the memory cells of the memory plane. It is by being programmed that a memory cell could become the equivalent of a fuse said to have undergone breakdown.

An object of the invention is a programmable MOS fuse comprising a tunnel oxide EEPROM cell of a memory plane made up of similar cells, a regulator of programming/erasing voltage Vpp which, by the programming of a switch-over command, gives a programming/erasure voltage Vpp with a slow-rising edge or steep edge, a slow-rising edge enabling a normal programming/erasing of the memory cell, a steep edge breaking down the tunnel oxide and thus placing the memory cell in an irreversible state.

BRIEF DESCRIPTION OF THE DRAWINGS

The invention will be understood more clearly and other characteristics will appear from the following description, given by way of an exemplary indication that in no way restricts the invention, and made with reference to the appended drawings, of which:

- FIG. 1 is a sectional drawing of a programmable MOS cell with floating gate;
- FIG. 2 is an electrical diagram corresponding to the programming in normal or fuse mode of an EEPROM cell according to the invention;
- FIG. 3 is a block diagram of an exemplary embodiment of a programming voltage generator with steep or slow-rising edge; and
- FIGS. 4.a and 4.b are timing diagrams of electrical signals corresponding to FIG. 3.

MORE DETAILED DESCRIPTION

FIG. 1 is a sectional view of a known EEPROM MOS cell C. It has a source zone S and a drain zone D which are, for example, N+ diffusions in a P type substrate. It further has a control gate GC which covers a floating gate GF, both being made of polycrystalline silicon. The floating gate GF is buried in silicon oxide 100 which insulates it particularly from the control gate GC and from the substrate. In fact, silicon oxide behaves like a dielectric, firstly between the control gate GC and the floating gate GF and, secondly, between the floating gate GF and the drain D or the source S, or again the substrate. We may use the term "capacitive coupling".

In a preferred way, a tunnel oxide region 0 is made at the level of the drain D. This is a region of silicon oxide that is thinner at the drain and facilitates the transfer of the charges from the drain D to the floating gate GF, and in the reverse direction, under the effect of an electrical field. The tunnel oxide therefore facilitates the programming and erasure of a memory cell such as this.

The erasing of the cell C consists in taking its control gate GC to a highly positive potential Vpp of the order of 20 volts and its drain D to the electrical ground Vss of the circuit. By capacitive coupling, between the control gate GC and the floating gate GF, the floating gate GF is also taken to a very positive potential, of the order of 10 volts. Thus an intense electrical field is created between the floating gate GF and the drain D, the source S of the cell being unconnected: electrons are then trapped beneath the floating gate GF. They induce a potential barrier that counters the conduction of the memory cell: the threshold voltage of the cell is high, of the order of 5 volts. It may be recalled that the threshold voltage is the minimum voltage that must be applied to the control gate GC for the memory cell C to become conductive.

Programming an EEPROM cell consists in bringing about the departure of the electrons stored beneath the floating gate GF: the direction of the previously applied electrical field is reversed. Thus, the drain D is taken to the potential Vpp and the control gate GC to the potential Vss, the source S being still unconnected (nc): the trapped electrons are then removed. To be sure of the programming, the electrical field is maintained for a sufficiently long time. This action also causes the departure of the free electrons, which contributed to the electrical neutrality of the material of the floating gate. In this way, holes are imported, so to speak, into the floating gate.

Reading the memory cell C consists in applying a reading voltage V1 to the control gate GC and a voltage Vcc of the order of five volts to the drain D. V1 is typically equal to 1.5 volts. Finally, a reading circuit 200 (FIG. 2), centered on a threshold voltage ranging from 0 to 5 volts, generally 2.5 volts, has its input 201 connected to the drain D at a point A. For example, this reading circuit will detect a "1" if the cell is programmed, and a "0" if it is erased. Indeed, the programmed cell behaves like a closed circuit since the voltage V1 at its control gate GC is higher than its threshold voltage of the order of −2 volts. The voltage at the point A drops and it is this drop that is detected by the reading circuit.

The erased cell, for its part, behaves like an open circuit, the voltage V1 being then lower than its threshold voltage of about 5 volts: the voltage at the point A does not drop.

However, the programming and erasure, which are cell writing operations, are delicate, as the tunnel oxide 0 is brittle, because of its small thickness (90 angstroms). Hence, a voltage regulator RG (FIG. 3) which calibrates the potential Vpp is used. Thus it is possible to prevent any peaks or voltage surges which could damage the oxide and then reduce the number of possible programming and erasing operations. In practice, in addition a slow switch-over of the potential Vpp is provided: the typical rise time is on the order of 2 ms. These conditions of programming/erasure enable about 100,000 programming/erasure operations before the cell is declared to be "dead".

In the invention, a switch-over command Ccom makes the voltage regulator RG delivers a signal Vpp that has either a slow-rising edge f ($\approx$2 ms) or a steep edge fr (100 $\mu$s) and is well calibrated (with no voltage surges). A signal such as this will then cause the breakdown of the tunnel oxide, i.e. pierce it, thus short-circuiting the drain D and the floating gate GF, without damaging the rest of the cell or the associated circuitry. This is therefore caused by the sudden application (steep edge) of the potential Vpp.

The short-circuit created between the drain D and the floating gate GF is irreversible. It is not possible, in any way, to reconstitute the tunnel oxide 0: it is an irreversible state. But then what is the nature of this state?

The short-circuit between the drain D and the floating gate GF no longer enables any storage of positive or negative charges on this floating gate GF: the corresponding threshold voltage is then substantially null.

A reading of the cell under "breakdown" with a circuit as described earlier therefore gives a logic output "1", namely a so-called programmed state. For, in this reading circuit, the reading voltage V1 applied to the gate GC is equal to about 1.5 volts: V1 is higher than the zero threshold voltage of the cell under breakdown. The cell under breakdown will therefore be conductive and the voltage at the point A will drop (FIG. 2).

With another type of reading circuit, using for example a value of V1 of the order of −1 volt, a so-called erased cell (which is not conductive) would then be read.

In any case, an irreversible state, "distinguishable" from a previous state by reading, is obtained: we have a fuse with tunnel oxide breakdown programmable by a slow-rising front/steep front switch-over command Ccom. It is therefore programmable at any time in an application.

Furthermore, it is a fuse with two states of operation: before undergoing breakdown, it is an undifferentiated memory cell of a memory plane (not shown). This makes it possible to validate the circuitry associated with the cell (access, decoding, programming/erasure, reading), and to increase the reliability of a fuse of this kind according to the invention. The standard fuses have an initial state and a final irreversible state. In the invention, a fuse first of all has a reversible initial state and a reversible final state, then by programming of (or switch-over to) a steep edge, it has an irreversible final state. It can also be said that we then have available, in the memory plane, cells which may be in three states: erased, programmed, or under breakdown. The qualities of electrical programming and erasure of an EEPROM memory cell have been combined with the quality of irreversibility of a fuse, to obtain a fuse that is programmable on demand and is highly reliable.

In practice, it is possible that a single steep edge is not enough to break down the fuse of the invention. It is then enough to read the state of the cell and to reapply a steep front if the cell is not in a state of breakdown. Of course, this assumes starting from the state different from that of the cell after breakdown, this state being the one read by the reading circuit. In the example of a reading voltage V1 of 1.5 volts, the cell has to be erased before the switch-over to the steep edge is done.

It is thus possible to have up to ten successive applications of a steep edge of the signal Vpp, i.e. ten loops, for example of a programming operation followed by a reading operation. This "breakdown algorithm" may easily be managed by microprocessor A. Or else, it may be chosen to apply ten successive steep edges systematically in using, for example, a counter.

FIGS. 3, 4.a and 4.b describe an example of a voltage regulator RG that makes it possible to obtain a signal Vpp with a slow-rising edge or steep edge according to the invention by programming. We have seen that the programming/erasure circuits use a voltage regulator RG to properly calibrate this signal Vpp. In a known way, this regulator is supplied by an external voltage or, preferably, by a voltage booster (charge pump) which receives the voltage Vcc from the circuit ($\approx 5$ volts) and sets up a higher voltage VH swiftly (for example in 20 $\mu$s). This voltage booster PC integrated into the circuit. The voltage VH given by the charge pump PC is equal to or greater than the voltage Vpp. For example, it may be equal to 25 volts.

Conventionally, the regulator RG is constituted, in a first stage, by a chain of transistors which are mounted as diodes (gate and drain short-circuited) so that each of them sets up a voltage, between its source and its drain, equal to its threshold voltage. Depending on the technology implemented, the threshold voltage is variable and the numbers of series-mounted transistors makes it possible to define the regulated voltage Vpp at the output of the regulator RG.

For example, for a threshold voltage of the order of 1 volt for each of the transistors in series, mounted as diodes, twenty transistors are needed to set up a regulated voltage Vpp of the order of 20 volts.

At output of the first stage, there is an analog circuit which constitutes the second stage of the regulator.

This analog circuit receives the output voltage of the first stage and gives a voltage in the form of a gradient rising from 0 to a value Vpp.

The slope of increase is about 1 to 2 milliseconds to reach Vpp: it is the signal Vpp with a slow-rising edge.

To obtain a steep edge, it suffices then to use a second analog circuit, the parameters of which would be computed to give a slope of increase of about 100 $\mu$s to go from 0 to Vpp.

It is enough, then, to actuate a switch by the switch-over command Ccom to select a steep edge or a slow-rising edge. However these analog circuits are complex (typically having several tens of transistors), bulky (they use capacitors) and highly dependent on the technological manufacturing parameters and on the temperature.

There is therefore proposed another preferred embodiment which includes a digital means. The regulator RG (FIG. 3) comprises, in a first stage, a set of k transistors in series, each transistor being mounted as a diode, with its gate connected to its drain so that, between the drain and source of each transistor, a voltage equal to the threshold voltage of this transistor is set up. Hence, at the terminals of the series-mounted set of k transistors, once the voltage at the terminals of this set puts them into saturation mode, a voltage is established equal to the sum of the threshold voltages of all the transistors, i.e. equal to k times the threshold voltage of the transistors if they all have the same threshold voltage Vtp.

In the example shown, the series-mounted set has k P channel transistors for an embodiment on a P channel substrate, each of the transistors being made in a trench separate from the others to have a more stable threshold voltage (through the elimination of the so-called "substrate" effect on the threshold voltage). One end of the series-mounted set of the P channel transistors is connected to the ground potential Vss. The other end is connected to output voltage VH of the charge pump PC.

The first stage of the regulator RG, thus constituted by a set of transistors in series, mounted between the voltage VH and the ground Vss, limits the voltage VH to a value kVtp. The necessary number k of transistors is chosen according to the desired value of the value Vpp and according to the value of the threshold voltages of the P channel transistors.

If necessary, there could be a number k of P channel transistors and a number k' of N channel transistors. However, there would be a lower stability of regulated voltage.

In one numerical example, the threshold voltage Vtp is of the order of 1 volt. About twenty P channel transistors are needed to have a voltage Vpp of about twenty volts.

The rise time of the signal Vpp is obtained by digital control of these transistors. This digital command uses a counter CT to give a rise time according to a desired profile. This counter CT is the second stage of the regulator. The counter CT has k outputs S1, S2, S3, ... Sk. The counter is controlled by a clock signal H1.

The outputs of the counter control switches I1, I2, ... Ik, capable of short-circuiting or "unshort-circuiting" each of the transistors of the series-mounted set of k transistors of the regulator. This counter works in count-up/countdown modes, and the selection of the counting direction is controlled by the switch-over command of the regulator, Ccom.

When it is the slow-rising edge that is selected by Ccom, and preferably it is the slow-rising edge that is selected when the voltage is turned on, the counter works in count-up mode. Thus, the output S1 makes it possible to short-circuit the P channel transistor closest to Vpp, the output S2 makes it possible to short-circuit the next one etc., and the output Sk makes it possible to short-circuit the P channel transistor connected to the ground. The logic levels present at the outputs S1, S2, ... Sk are between 0 volts and the high voltage Vpp, the counter being consequently supplied by the voltage Vpp produced.

The counting gets triggered during the command for the production of a voltage Vpp. This command is provided, for example, by a memory cell writing signal W. The counter initially has all its outputs in a logic state such that they short-circuit all the transistors. In the example shown, the switches controlled by the outputs of the counter are N channel transistors and are short-circuited by a high-level voltage at their gate. It will be assumed therefore that, at the outset, the outputs of the counter all give a high logic state.

The signal W then permits the counting by the counter. The counter is not a binary counter (or, if it is one, it is followed by a decoder). At the first clock stroke, it sets up a low state on the output S1; then, at the second clock stroke, it sets up a low state on the output S2 without modifying the low state of S1; and continuing in this way, it sets up a low state on each of the successive outputs up to Sk, leaving in place, at each time, the previous output in the state in which it had put it at the previous clock stroke. In twenty clock strokes, in one example with twenty P channel transistors, the outputs all change to the low state and all the transistors of the regulator are unshort-circuited When the last output Sk goes to the low state, it turns off the counting (for example by turning off the passage of the signal H1 to the counter CT clock), so that the regulator remains in this configuration, up to the end of the command for producing Vpp or even, in practice, up to a new command for preparing Vpp (new writing signal W).

The result thereof is that, even if the charge pump produces a high voltage very swiftly as is the case in practice ($\approx 20$ μs for example), the regulator will restrict this voltage to a value which will be 0, then Vtp, then 2 Vtp, etc., up to kVtp, i.e. the desired final voltage Vpp.

The voltage Vpp, thus limited by the variable threshold regulator, will rise in steps at the rate of occurrence of the strokes of the clock signal H1 (which can be easily controlled with precision).

When it is the steep edge that is selected by Ccom, the counter works in countdown mode. Thus, the outputs S1 to Sk deshort-circuit all the P transistors at the same time.

The countdown too is triggered during the command for the production of a voltage Vpp, given in the example by the signal W. The counter initially has all its outputs in a high logic state: they short-circuit all the N transistors (switches I1, . . . Ik).

The signal W then permits the countdown by the counter.

The countdown is stopped after the first stroke of the clock signal H1. For, the first countdown makes all the outputs of the counter go to the low logic level. Now, it has been provided that when the last output Sk goes to the low state, it turns the clock signal H1 off: it therefore turns off the countdown. In this way, the regulator stays in this configuration up to the end for the command to produce Vpp or even, in practice, up to a new command for preparing Vpp (new writing signal W). The countdown could be turned off when any output S1 to Sk goes to the low state, since they all change state at the same time.

FIGS. 4.a and 4.b represents this increase in the limit voltage of the regulator (hence the increase in Vpp) in relation with the operations of successive switch-over (FIG. 4.a) or simultaneous switch-over (FIG. 4.b) of the logic state of the successive outputs S1 to Sk of the counter CT.

If we have 20 P channel transistors, the threshold voltages being equal to about 1 volt, the counter will have 20 outputs. In count-up mode, to obtain a voltage going from 0 volts to 16 or 17 volts approximately in a little less than 2 milliseconds, a 10 kilohertz clock signal H1 will have to be taken. In countdown mode, the rise time which is a clock period will then be 100 μs.

More generally, to obtain a slow rise time Tm, with a counter having k outputs and a regulator having k possible limit voltages, a clock with a frequency k/Tm will be used. The frequency could be between k/2 and k kilohertz for a rise time of 1 to 2 milliseconds. The fast rise time is, for its part, Tm/k.

Experience shows that the steps of the voltage Vpp obtained by the counting operation (slow-rising edge) are not a great hindrance. Firstly, they exist only during the transitory stage of the rise of Vpp. Secondly, the numerous unwanted resistances and capacitances of the circuits that Vpp is designed to supply, very sharply attenuate these steps.

Besides, a regulator RG with digital control as described enables the use, for the breakdown, of a voltage Vpp with steep front, with a value that is higher than that of the slow-rising edge. For example, the voltage Vpp with a steep edge may be higher than the voltage Vpp, with a slow-rising edge, by a few Vtp. Indeed, in the first stage, it is enough to have k+n P channel transistors in series, mounted as diodes, and one counter with n+k outputs (S1 to Sk+n). In count-up mode (in obtaining a slow-rising edge), only the first k transistors are successively unshort-circuited according to the principle already described. By contrast, in countdown mode, the n+k transistors are all unshort-circuited at the same time: in the former case Vpp equals kVtp; in the latter case, Vpp equals (k+n)Vtp. If k equals 20 and n equals 5, there is, for example, a voltage Vpp equal to about 20 volts for the programming and erasure, and equal to about 25 volts for the breakdown of the memory cell. This is possible on condition, however, that the value VH given at the input of the regulator is at least equal to the value sought, 25 volts in the example. Indeed, at output, the regulator can deliver only a voltage equal, at the maximum, to VH.

A higher breakdown voltage such as this, combined with a steep edge, enables the breakdown of the tunnel oxide to be improved. The count-up and countdown operations can still be stopped when the output Sk of the counter passes to the low state since, for the countdown, the states at the outputs S1 to Sk+n are all set up at the same time.

In the same way, a counter for which it is possible to initialize a value, for example by the programming of a register of the counter, in a regulator according to the invention, is within the scope of the invention. This possibility provides, for example, for the choice, by programming the counter, of the value of Vpp for the breakdown. For example, this value may be equal to kVtp or (k+1)Vtp, . . . (k+n)Vtp, and initialized by programming in the counter. For example, the breakdown value may be determined by the breakdown algorithm.

What is claimed is:
1. A programmable MOS fuse comprising:
a tunnel oxide EEPROM cell, and
a voltage regulator of programming/erasing voltage Vpp which, by the receipt of a switch-over command, selectively gives a programming/erasure voltage Vpp with a slow-rising edge or a programming/erasure voltage Vpp with a steep edge,
said programming/erasure voltage Vpp with a slow-rising edge enabling a normal programming/erasing of the cell, and
said programming/erasure voltage Vpp with a steep edge breaking down the tunnel oxide region for the purpose of placing the cell in an irreversible state.
2. A fuse according to claim 1, wherein the voltage regulator includes a set of transistors which are mounted as diodes and connected in series, with each of said transistors setting up a voltage, between its source and its drain that is equal to its threshold voltage, and a counter capable of setting up a determined logic state at each of its outputs, either successively for a switch-over command to switch over to a programming/erasure voltage Vpp with a slow-rising edge or simultaneously for a switch-over command to switch over to a programming/erasure voltage Vpp with a steep edge, and circuits controlled by the outputs of the counter to initially short-circuit the transistors mounted as diodes and then to unshort-circuit them either gradually one after the other as and when the switch-over command for a programming/erasure voltage Vpp with a slow-rising edge takes place or all at the same time as and when the switch-over command for a programming/erasure voltage Vpp with a steep edge takes place.

3. A fuse according to claim 2, wherein the counter is a circuit with k outputs which, in count-up mode, at each stroke of a clock signal, sets up a determined logic level on a new output, leaving in place each time the level set up at the previous output, and which, in count-down mode, at a stroke of a clock signal, sets up a determined logic level on all of the outputs; and wherein the voltage regulator further comprises a circuit to stop the counting up and counting down by said counter when a selected output has been placed at a determined logic level.

4. A fuse according to claim 2, wherein the counter is a circuit with k+n outputs which, in count-up mode, at each stroke of a clock signal, sets up a determined logic level on a new output of the k first outputs of orders 1 to k, one after the other, leaving in place each time the level set up on the previous output, and which, in count-down mode sets up, at a stroke of a clock signal, a determined logic level on all of the k+n outputs; and wherein the voltage regulator further comprises a circuit to stop the counting up and counting down by said counter when the order k output has been placed at the determined logic level.

5. A fuse according to claim 1 wherein said cell is part of a memory plane made up of similar cells.

6. A fuse according to claim 1 wherein said voltage regulator comprises a first stage and a second stage;
said first stage comprising a first set of transistors which are mounted as diodes and connected in series between a supply voltage and a reference voltage, with each of said transistors setting up a voltage, between its source and its drain that is equal to its threshold voltage;
said second stage comprising a circuit, associated with said first stage, to cause the production of a programming/erasure voltage Vpp with a slow-rising edge in response to said voltage regulator receiving a switch-over command to produce a programming/erasure voltage Vpp with a slow-rising edge, and to cause the production of a programming/erasure voltage Vpp with a steep edge in response to said voltage regulator receiving a switch-over command to produce a programming/erasure voltage Vpp with a steep edge.

7. A fuse according to claim 1 wherein said voltage regulator comprises a first stage and a second stage;
said first stage comprising a first set of transistors which are mounted as diodes and connected in series between a supply voltage and a reference voltage, with each of said transistors setting up a voltage, between its source and its drain that is equal to its threshold voltage, each of said transistors having associated therewith a respective short-circuiting circuit to selectively short-circuit the associated transistor;
said second stage comprising a counter having a plurality of outputs, said counter being capable of setting up a determined logic state at each of its outputs, either successively in response to a switch-over command to produce a programming/erasure voltage Vpp with a slow-rising edge or simultaneously in response to a switch-over command to produce a programming/erasure voltage Vpp with a steep edge,
said short-circuiting circuits being controlled by the outputs of the counter to initially short-circuit the transistors of said first set, said short-circuiting circuits being controlled by the outputs of the counter to unshort-circuit the transistors of said first set one at a time in response to the counter receiving a command for a programming/erasure voltage Vpp with a slow-rising edge, said short-circuiting circuits being controlled by the outputs of the counter to unshort-circuit all of the transistors of said first set at one time in response to the counter receiving a command for a programming/erasure voltage Vpp with a steep edge.

8. A fuse according to claim 7 wherein each of said first set of transistors is made in a trench separate from the other transistors of said first set, to have a more stable threshold voltage.

9. A fuse according to claim 1 wherein each short-circuiting circuit comprises an N channel transistor which is short-circuited by a high-level voltage at its gate.

10. A fuse according to claim 1 further comprising a reading circuit for reading the state of said cell, and a microprocessor, said microprocessor being connected to selectably;
direct said voltage regulator to apply a programming/erasing voltage waveform, having a steep-rise characteristic intermediate between said steep edge and said slow-rising edge, between the control gate and the drain of said cell,
direct said reading circuit to read the state of said cell, and
successively direct the repetition of such application of said programming/erasing voltage, having an intermediate steep-rise characteristic, and such reading of the state of said cell until the reading circuit indicates that the breakdown of said cell has been accomplished.

11. A fuse according to claim 1 further comprising a counter which is connected to direct said voltage regulator to apply a programming/erasing voltage waveform, having a steep-rise characteristic intermediate between said steep edge and said slow-rising edge, between the control gate and the drain of said cell, a predetermined number of times.

12. A fuse according to claim 1 wherein the tunnel oxide region in said cell is at the level of the drain of said cell.

13. A process for altering the state of a programmable MOS fuse comprising a tunnel oxide EEPROM cell having a source, a drain, a control gate, a floating gate, and a tunnel oxide region, which process comprises the steps of:
applying a first programming/erasing voltage, having a slow-rise, between the control gate and the drain of said cell in a first polarity direction, when it is desired to change the state of the cell from the erased state to the programmed state,
applying a second programming/erasing voltage, having a slow-rise, between the control gate and the drain of said cell in a second polarity direction, when it is desired to change the state of the cell from the programmed state to the erased state, said second polarity direction being opposite to said first polarity direction, and
applying a third programming/erasing voltage, having a steep-rise, between the control gate and the drain of said cell when it is desired to change the state of the cell to an irreversible breakdown state.

14. A process in accordance with claim 13 wherein said first programming/erasing voltage, having a slow-rise, and said second programming/erasing voltage, having a slow-rise, have the same magnitude.

15. A process in accordance with claim 13 wherein the magnitude of said third programming/erasing voltage is greater than the magnitude of said first programming/erasing voltage, and also greater than the magnitude of said second programming/erasing voltage.

16. A process in accordance with claim 13 wherein the step of applying a third programming/erasing voltage, having a steep-rise, between the control gate and the drain of said cell is successively repeated a plurality of times.

17. A process in accordance with claim 13 wherein the step of applying a third programming/erasing voltage, having a steep-rise, between the control gate and the drain of said cell is followed by a step of reading the state of the cell.

18. A process in accordance with claim 17 wherein, if the application of said third programming/erasing voltage, having a steep-rise, between the control gate and the drain of said cell has not changed the thus read cell to an irreversible breakdown state, the step of reading is followed by a repeating of the step of applying a third programming/erasing voltage, having a steep-rise, between the control gate and the drain of said cell.

19. A process in accordance with claim 17 wherein said cell is in the erased state at the time of the first occurrence of the step of applying a third programming/erasing voltage, having a steep-rise, between the control gate and the drain of said cell.

20. A process in accordance with claim 17 wherein the combination of a step of applying a third programming/erasing voltage, having a steep-rise, between the control gate and the drain of said cell and the step of reading the state of the cell is successively repeated a plurality of times.

21. A process in accordance with claim 13 wherein said cell is a memory cell which is part of a memory plane made up of similar cells.

22. A process in accordance with claim 13 wherein said first, second and third programming/erasing voltages are created by a set of transistors mounted as diodes and connected in series between a voltage source and a circuit ground, with each of the transistors of said set having a respective selectively operable short-circuiting path associated therewith, with each of said transistors of said set in a non-short-circuited condition setting up a voltage between its source and its drain that is equal to its threshold voltage, wherein said first programming/erasing voltage is provided by initially short-circuiting the transistors of said set and then changing each transistor of said set one after another in succession from a short-circuited condition to a non-short-circuited condition, and wherein said third programming/erasing voltage is provided by initially short-circuiting the transistors of said set and then changing each transistor of said set simultaneously from a short-circuited condition to a non-short-circuited condition.

23. A process in accordance with claim 22, wherein a second set of transistors mounted as diodes is connected in series with said first set between said voltage source and said circuit ground, wherein only the transistors of said first set are changed from the short-circuited condition to the non-short-circuited condition during the creation of said first programming/erasing voltage, and wherein the transistors of said first set and said second set are changed from the short-circuited condition to the non-short-circuited condition during the creation of said third programming/erasing voltage.

24. A process in accordance with claim 13, wherein the rise time of said slow-rising edge is on the order to 2 ms, while the rise time of said steep edge is on the order to 100 $\mu$s.

25. A nonvolatile memory comprising:
a plurality of floating-gate memory cells, each comprising a floating gate and a thin dielectric layer through which small amounts of current can flow to said floating gate; and
a voltage regulator connected to programmably supply a programming/erasing voltage Vpp to a selected one of said cells such that,
when a first mode of said regulator has been selected, said regulator supplies said programming/erasure voltage Vpp with a slow-rising edge, thereby enabling reversible programming/erasing of the selected one of said cells, and
when a second mode of said regulator has been selected, said regulator supplies said programming/erasure voltage Vpp with a steep-rising edge, thereby enabling irreversible programming/erasing of the selected one of said cells.

26. The memory of claim 25, wherein each said floating-gate memory cell is a tunnel oxide EEPROM cell.

27. The memory of claim 25, wherein each said floating-gate memory cell comprises a control gate, a floating gate, a source, and a drain; and wherein said programming/erasing voltage Vpp is applied between control gate and drain of said selected one of said cells.

* * * * *